US012621002B2

(12) United States Patent　(10) Patent No.: US 12,621,002 B2
　　Kussian　(45) Date of Patent: May 5, 2026

(54) OPTIMIZATIONS FOR RESOLVER-TO-DIGITAL CONVERTERS

(71) Applicant: Infineon Technologies AG, Neubiberg (DE)

(72) Inventor: Reinhard Kussian, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 146 days.

(21) Appl. No.: 18/637,102

(22) Filed: Apr. 16, 2024

(65) Prior Publication Data

US 2025/0080133 A1　Mar. 6, 2025

Related U.S. Application Data

(60) Provisional application No. 63/579,447, filed on Aug. 29, 2023.

(51) Int. Cl.
　H03M 3/00 (2006.01)
　G01B 7/30 (2006.01)
　G01D 5/20 (2006.01)
(52) U.S. Cl.
　CPC .............. H03M 3/388 (2013.01); G01B 7/30 (2013.01); G01D 5/20 (2013.01); H03M 3/458 (2013.01)
(58) Field of Classification Search
　CPC ......... H03M 3/00; H03M 3/388; H03M 3/458
　See application file for complete search history.

(56) References Cited

U.S. PATENT DOCUMENTS

| | | | | |
|---|---|---|---|---|
| 4,857,926 A | * | 8/1989 | Neglia | .................. G01D 5/208 |
| | | | | 318/656 |
| 4,975,699 A | * | 12/1990 | Frey | ......................... G06J 1/00 |
| | | | | 341/147 |
| 6,020,838 A | * | 2/2000 | Knudsen | .............. H03M 3/388 |
| | | | | 341/143 |

(Continued)

OTHER PUBLICATIONS

Auger et al., "Design of advanced resolver-to-digital converters", Ireena, Jun. 6, 2011, 16 pp.

(Continued)

*Primary Examiner* — Lam T Mai
(74) *Attorney, Agent, or Firm* — Shumaker & Sieffert, P.A.

(57) ABSTRACT

In general, techniques are described for optimizations to resolver-to-digital signal converters. Processing circuitry comprising a delta-sigma analog-to-digital converter and a fixed-point signal processor may perform the techniques. The delta-sigma analog-to-digital converter may be communicatively coupled to a fixed-point digital signal processor and electrically coupled to a resolver sensor attached to a rotating element controlled by the processing circuitry, where the delta-sigma analog-to-digital converter is configured to obtain, based on electrical interactions with the resolver sensor, a digital cosine value for an indirectly sensed angle of the rotating element and a digital sine value for the indirectly sensed angle of the rotating element. The fixed-point digital signal processor may be configured to implement a fixed-point Luenberger Observer resolver-to-digital converter configured to obtain, based on the digital sine value and the digital cosine value, via fixed-point mathematical operations, an approximate angle of the rotating element.

22 Claims, 6 Drawing Sheets

(56) References Cited

U.S. PATENT DOCUMENTS

| | | | | |
|---|---|---|---|---|
| 6,220,158 B1* | 4/2001 | Hartmann | | B41F 33/14 |
| | | | | 250/559.38 |
| 6,445,317 B2* | 9/2002 | Lundin | | H03M 1/1038 |
| | | | | 341/120 |
| 6,925,401 B2* | 8/2005 | Kameya | | H02P 6/17 |
| | | | | 341/112 |
| 7,821,434 B2* | 10/2010 | Huppertz | | H03M 3/384 |
| | | | | 341/120 |
| 9,270,293 B2* | 2/2016 | Mandal | | H03M 1/38 |
| 10,090,854 B1* | 10/2018 | Clara | | H03M 1/70 |
| 10,177,779 B2* | 1/2019 | Lee | | H03M 1/462 |
| 11,387,838 B1* | 7/2022 | Dyer | | H03M 1/1033 |
| 2005/0122247 A1* | 6/2005 | Hammerschmidt | .. | H03M 1/002 |
| | | | | 341/163 |
| 2006/0097108 A1* | 5/2006 | Liu | | G01D 3/02 |
| | | | | 244/79 |
| 2008/0024338 A1* | 1/2008 | Huang | | H03M 1/1028 |
| | | | | 341/120 |
| 2014/0320328 A1* | 10/2014 | Moazzami | | H03M 1/1245 |
| | | | | 341/155 |
| 2014/0346990 A1* | 11/2014 | Dib | | H02P 21/18 |
| | | | | 318/400.32 |
| 2015/0120026 A1* | 4/2015 | Zhang | | H03M 1/124 |
| | | | | 341/161 |
| 2015/0372691 A1* | 12/2015 | Mandal | | H03M 1/38 |
| | | | | 341/110 |
| 2016/0182073 A1* | 6/2016 | Speir | | H03M 1/121 |
| | | | | 341/120 |
| 2018/0183455 A1* | 6/2018 | Lee | | H03M 1/466 |
| 2018/0183456 A1* | 6/2018 | Lee | | H03M 1/442 |
| 2020/0217640 A1* | 7/2020 | Märgner | | G01D 5/2448 |
| 2021/0218409 A1* | 7/2021 | Ho | | H03M 1/804 |
| 2022/0221308 A1* | 7/2022 | Heiling | | G01D 5/2073 |
| 2022/0345149 A1* | 10/2022 | Bal | | H03M 3/496 |
| 2022/0368338 A1* | 11/2022 | Jin | | H03M 1/1014 |
| 2024/0151279 A1* | 5/2024 | Weißbacher | | G05B 13/021 |
| 2024/0213898 A1* | 6/2024 | Jefremow | | H02P 21/09 |
| 2025/0337434 A1* | 10/2025 | Jefremow | | G06N 3/0455 |

OTHER PUBLICATIONS

Hoseinnezhad et al., "A Novel Hybrid Angle Tracking Observer for Resolver to Digital Conversion", Proceedings of the 44th IEEE Conference on Decision and Control, Dec. 15, 2005, pp. 7020-7025.

Krah et al., "FPGA Based Resolver to Digital Converter Using Delta-Sigma Technology", Proceedings of PCIM Europe 2006, May 1, 2006, pp. 931-936.

Zhang, "Information Driven Control Design: A Case for PMSM Control", ETD Archive, 2017, 174 pp., (Applicant points out, in accordance with MPEP 609.04(a), that the year of publication, 2017, is sufficiently earlier than the effective U.S. filing date, so that the particular month of publication is not an issue.).

\* cited by examiner

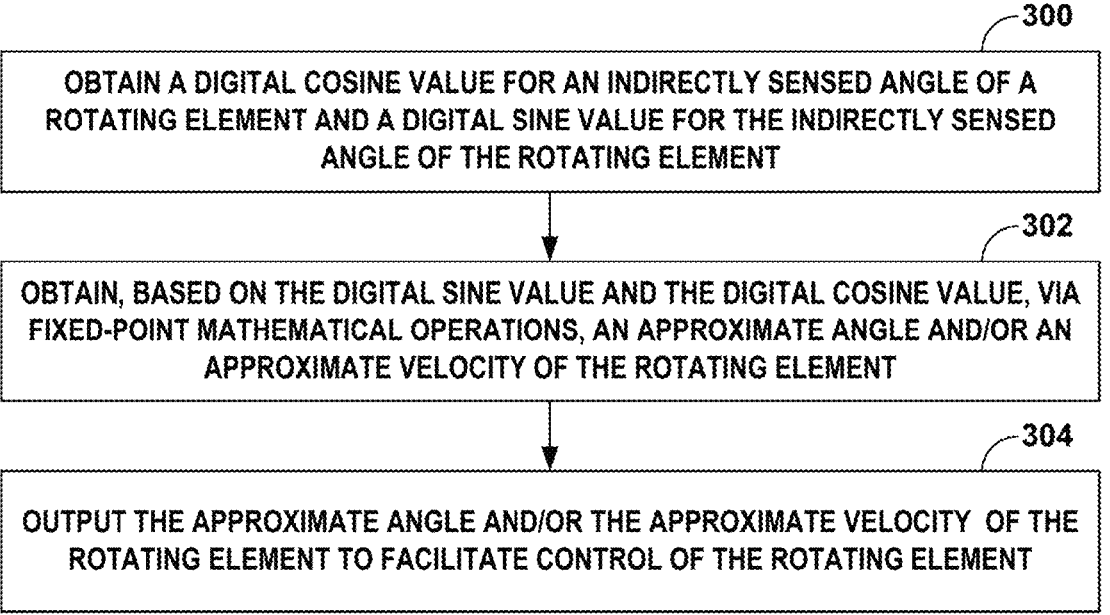

300

OBTAIN A DIGITAL COSINE VALUE FOR AN INDIRECTLY SENSED ANGLE OF A ROTATING ELEMENT AND A DIGITAL SINE VALUE FOR THE INDIRECTLY SENSED ANGLE OF THE ROTATING ELEMENT

302

OBTAIN, BASED ON THE DIGITAL SINE VALUE AND THE DIGITAL COSINE VALUE, VIA FIXED-POINT MATHEMATICAL OPERATIONS, AN APPROXIMATE ANGLE AND/OR AN APPROXIMATE VELOCITY OF THE ROTATING ELEMENT

304

OUTPUT THE APPROXIMATE ANGLE AND/OR THE APPROXIMATE VELOCITY OF THE ROTATING ELEMENT TO FACILITATE CONTROL OF THE ROTATING ELEMENT

FIG. 3

OPTIMIZATIONS FOR
RESOLVER-TO-DIGITAL CONVERTERS

This application claims the benefit of U.S. Provisional Application No. 63/579,447, filed Aug. 29, 2023, which is incorporated by reference as if fully set forth herein.

TECHNICAL FIELD

This disclosure relates to resolver-to-digital converters (RDCs) for computing devices.

BACKGROUND

Processors, such as microcontrollers, are increasingly being deployed in industrial settings (e.g., for motor control and signal processing), vehicles (e.g., control of combustion engines, electrical and hybrid vehicles, transmission control units, chassis domains, braking systems, electrical power steering systems, driver assistance systems, etc.), and the like. Microcontrollers may include hardware to implement resolver-to-digital converters (RDCs), which may refer to signal processing for resolving an angle and velocity of a rotating element. The RDCs may interface with a resolver sensor coupled to the rotating element to obtain a sine signal and a cosine signal representative of the angle and/or the velocity of the rotating element to which the resolver sensor is coupled. Accurate (within acceptable tolerances given an application of resolver sensor) and timely (within time delay tolerances) derivation of the angle and/or the velocity from the sine signal and cosine signal may enable the microcontroller to more accurately control operating of the rotating element.

Hardware configured to implement RDCs may comprise a field programmable gate array (FPGA) having large on-chip memory for data storage and/or a processing core programmed to execute software for performing RDCs (or aspects thereof). While an FPGA and/or processing core may improve accuracy associated with RDCs given the large memory for lookup tables and given that such implementations may provide for floating-point calculations, they are undesired for causing extra costs and performing less due to limited data rates. Therefore, it is desired in the industry to already include high-performing RDCs (or aspects thereof) into application-specific integrated circuits (ASICs). One way is to enrich ASICs with a DSP and execute software on the DSP for performing RDCs (or aspects thereof). Another way is to design RDCs in hardware. In both cases, fixed-point algorithms providing the required accuracy are superior, due to less area requirements and less licensing costs. Transitioning to ASICs, resource handling between following dimensions is inevitable: (1) performance, (2) memory, (3) calculation/execution time. Most RDCs rely on the use of the arctangent function to calculate the position (and with that help the velocity) of the rotating element. The approach evinces two major disadvantages: (1) a precise arctangent function requires a large number of calculation cycles or a large memory, and (2) the precision of the angle and velocity rely on the correction of the round trip when the carrier (or information thereof) is used to demodulate the amplitude-modulated sine and cosine signals of the resolver sensor.

In contrast, Luenberger-Observer-based RDCs mitigate these disadvantages by using a feedback structure that allows for replacing the arctangent calculation on the one side, and on the other side, to give less to no care about the round trip delay that causes the shift between amplitude-modulated sine/cosine information and the carrier information. Angle and velocity approximation, demodulation of the amplitude-modulated sine and cosine signals, as well as a tracking observer can be achieved within one second-order control system.

SUMMARY

In general, techniques are described for optimizations of a resolver-to-digital converter (RDC) implemented in a fixed-point portion of a microcontroller or other processing circuitry that facilitates accurate (within defined accuracy tolerances) and timely (within defined timeliness tolerances) derivation of an angle and/or velocity of a rotating element which, upon the receipt of angle and/or velocity information, can be controlled by an external controller or by the same microcontroller that provides the angle and/or velocity information and executes the LO-based RDC algorithms. A microcontroller or other processing circuitry may include a digital signal processor (DSP) (which is one example of a DSP) configured to implement Luenberger Observer (LO) RDC ("LORDC") that provides a number of different configurable variables to potentially facilitate optimization of a LORDC implementation. The DSP may represent a fixed-point DSP that performs single sample/single point data processing. In contrast to floating-point hardware, fixed-point hardware is favorable for low-cost and low-power implementations with small chip area.

Furthermore, the DSP may include a limited size lookup table (LUT) used to represent a cosine wave and a sine wave used for reference in observing (or otherwise computing or deriving) an approximate angle of a rotating element via a resolver sensor. The size of the LUT relates to the accuracy of the angle and velocity estimation. Decreasing the LUT size may increase a step size between two values stored to subsequent LUT entries, thereby decreasing the accuracy in determining a cosine of the approximate angle and a sine of the approximate angle, which may also result in errors during observation of the angle and/or velocity. Another error source is the quantization of a fixed-point implementation, which may result in limitations on value size as well as accuracy. The LUT for sine and cosine wave reference provides only a fixed number of bits, but also the quantization of coefficients influences the accuracy. In addition, integrator wrap values only vaguely representing the constant pi ($\pi$) may further increase the inaccuracy. Especially in closed-loop systems, like the LO-based RDC, all these imperfections may result in undesired local errors that the feedback may try to correct. In some cases, e.g., coefficient quantization, the error might be accumulating over time. To address the inherent limitations of the fixed-point DSP and the limited size of the LUT, the LORDC may be configured with a configurable step size for the LUT and a configurable wrap gain ($G_W$). Decreasing step size may increase consumption of memory for the LUT given that more entries may be required with a smaller step size.

In contrast, the $G_W$ may allow for optimization that improves the accuracy of wrap around, which refers to wrapping around a value computed for each of the cosine and sine of the approximate angle considering that the cosine and sine functions have a period of 2 multiplied by pi ($\pi$). That is, the function repeats cyclically after multiples of two (2) multiplied by pi ($\pi$). LORDC may approximate the angle by integrating an approximate velocity, which eventually results in an approximate ever-increasing angle. The bit-width-limited integrator providing the approximate angle would overflow, which results in a phase error due to the value of the integrated velocity may not represent $2\pi$.

By exposing the configurable step size and $G_W$, a designer of LORDC may optimize application of LO to determine the approximate angle in a manner that accommodates both fixed-point limitations associated with the fixed-point DSP and a limited size for the LUT. The step size may allow for various different implementations for storing a quarter (¼), a half (½), or a full (1) representation of the cosine and sine values of the approximate angle to tailor accuracy while balancing memory consumption, where a quarter representation may allow for a smaller step size compared to a half representation or a full representation and a half representation may allow for a smaller step size compared to a full representation. Selecting the step size may allow the designer to balance the limited size of the LUT in view of timing and accuracy and/or precision requirements of a given implementation of the LORDC. The $G_W$ may further allow the designer to balance the limited size of the LUT in view of timing and accuracy and/or precision requirements of a given implementation of the LORDC.

In this way, various aspects of the techniques may enable a fixed-point, limited memory DSP to accommodate different requirements for memory size, timing (e.g., execution time), and precision (e.g., angle or phase error) for estimating the approximate angle of the rotating element, while possibly maintaining the inherent benefits of a LORDC implementation. Such benefits of the LORDC implementation may include reduced computing resource utilization (in terms of execution cycles, memory, and memory bus bandwidth utilization along with associated power consumption) while abstaining from utilizing additional components that may increase the complexity and possibly the monetary cost of motor/engine control systems.

In addition, the benefits of the LORDC implementation removes the need for extra arctangent operation, filtering and velocity calculation in hardware or software while only potentially requiring one LORDC. Further, the LORDC may inherently represent a low pass and may provide relaxed timing requirements for the carrier signal. As such, various aspects of the LORDC optimization techniques may improve operating of LORDC systems themselves.

In one example, aspects of the techniques are directed to processing circuitry comprising: a delta-sigma analog-to-digital converter communicatively coupled to a fixed-point digital signal processor and electrically coupled to a resolver sensor attached to a rotating element controlled by the processing circuitry, the delta-sigma analog-to-digital converter configured to obtain, based on electrical interactions with the resolver sensor, a digital cosine value for an indirectly sensed angle of the rotating element and a digital sine value for the indirectly sensed angle of the rotating element; and a fixed-point digital signal processor configured to implement a fixed-point Luenberger Observer resolver-to-digital converter that obtains, based on the digital sine value and the digital cosine value, via fixed-point mathematical operations, an approximate angle of the rotating element.

In another example, aspects of the techniques are directed to a method comprising: obtaining, by a delta-sigma analog-to-digital converter of a microcontroller, and based on electrical interactions with a resolver sensor, a digital cosine value for an indirectly sensed angle of a rotating element and a digital sine value for the indirectly sensed angle of the rotating element; obtaining, by a fixed-point Luenberger Observer resolver-to-digital converter implemented by a fixed-point digital signal processor of the microprocessor, and based on the digital sine value and the digital cosine value, via the fixed-point mathematical operations, an approximate angle of the rotating element; and outputting, by the fixed-point Luenberger Observer resolver-to-digital converter, the approximate angle to facilitate control of the rotating element.

In another example, aspects of the techniques are directed to a system comprising: a rotating element; a resolver sensor attached to the rotating element; and a microcontroller communicatively coupled to the resolver sensor and configured to control the rotating element, the microcontroller comprising: a delta-sigma analog-to-digital converter communicatively coupled to the fixed-point digital signal processor and electrically coupled to the resolver sensor, the delta-sigma analog-to-digital converter configured to obtain, based on electrical interactions with the resolver sensor, a digital cosine value for an indirectly sensed angle of the rotating element and a digital sine value for the indirectly sensed angle of the rotating element; and a fixed-point digital signal processor configured to implement a fixed-point Luenberger Observer resolver-to-digital converter that obtains, based on the digital sine value and the digital cosine value, via fixed-point mathematical operations, an approximate angle of the rotating element.

The details of one or more aspects of the techniques are set forth in the accompanying drawings and the description below. Other features, objects, and advantages of these techniques will be apparent from the description and drawings, and from the claims.

BRIEF DESCRIPTION OF DRAWINGS

FIG. 3 is a flowchart illustrating example operation of the microcontroller of FIG. 1 in performing optimized resolver-to-digital conversion in accordance with various aspects of the techniques described in this disclosure.

DETAILED DESCRIPTION

Figure 1:
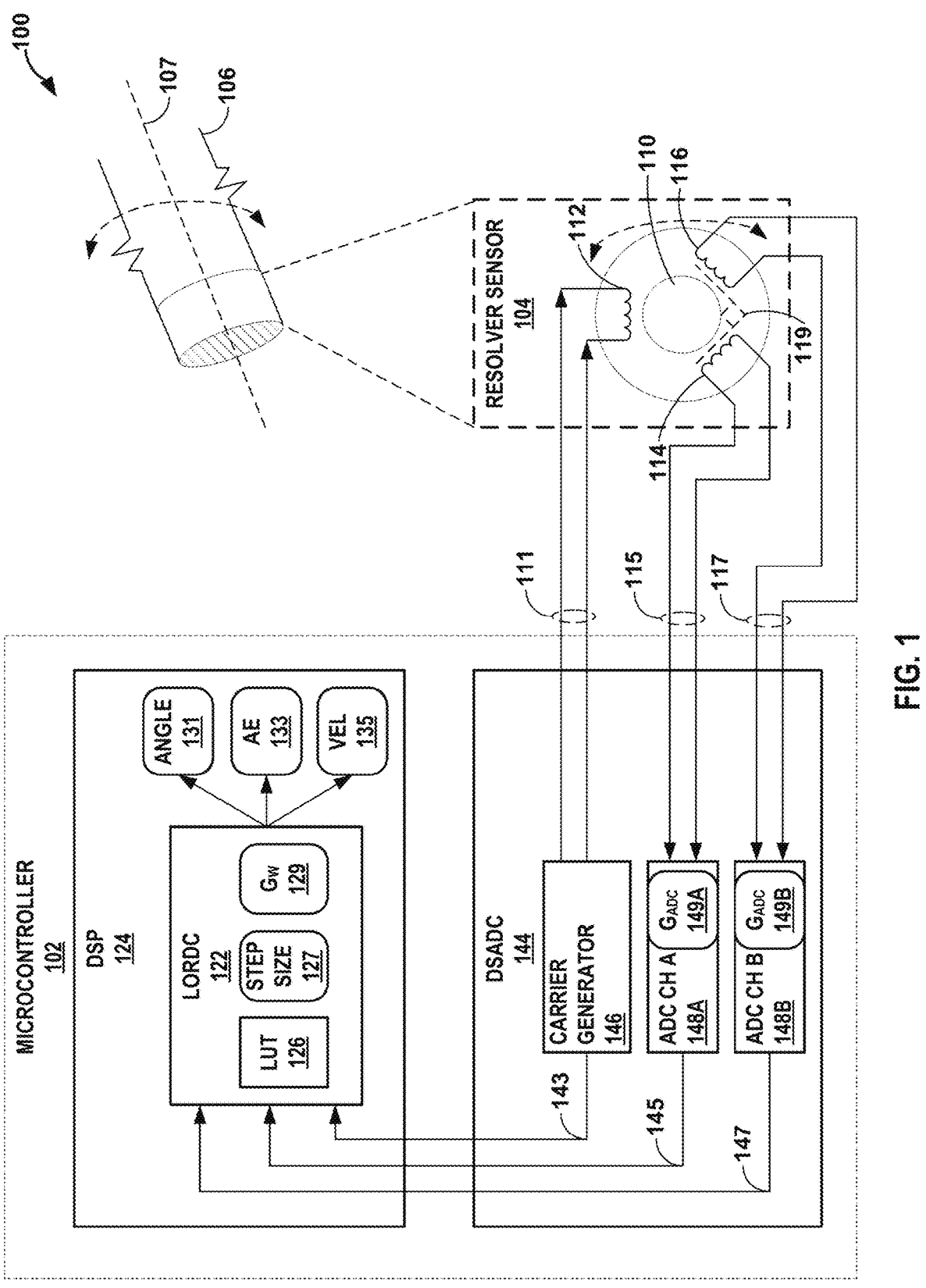
FIG. 1 is a diagram illustrating an example system configured to perform various aspects of the resolver-to-digital converter (RDC) techniques described in this disclosure.

FIG. 1 is a diagram illustrating an example system configured to perform various aspects of the resolver-to-digital converter (RDC) techniques described in this disclosure. In the example of FIG. 1, a system 100 includes a microcontroller 102, a resolver sensor 104, and a rotating element 106 to which resolver sensor 104 is attached or otherwise mechanically affixed.

Microcontroller 102 may represent one example of processing circuitry configured to control system 100. While described with respect to microcontroller 102, various aspects of the techniques may be implemented by other types of processing circuitry, including a central processing unit (CPU), a multi-core processing unit (where each core of multiple cores forming the multi-core processing unit may represent a portion of a CPU, which may share on-chip memory, and other resources formed as part of a package, such as a system on a chip—SoC), a system on a chip (SoC), a graphics processing unit (GPU), an application specific integrated circuit (ASIC), a field programmable gate array (FPGA), a digital signal processor (DSP), and the like.

Resolver sensor 104 may represent a sensor configured to indirectly sense rotational (or angular) movement. Resolver sensor 104 is, in the example of FIG. 1, attached or otherwise mechanically affixed to rotating element 106. Rotating element 106 may represent any type of element configured to rotate or otherwise spin about a central axis 107. Rotation is denoted by a dashed arrow, where in the example of FIG. 1, rotating element 106 is shown as rotating clockwise about central axis 107. Rotating element 106 may represent an axel, a shaft (such as a shaft of one of an electric motor, a servo, and the like), or any other rotating element configured to rotate around a central axis 107. Resolver sensor 104 may represent one or more of a brushless resolver sensor, a slab resolver sensor, a pancake resolver sensor, a receiver resolver sensor, a differential resolver sensor, and the like.

Resolver sensor 104 may include a rotor 110, an excitation stator 112, a sine stator 114, and a cosine stator 116 displaced approximately 90 degrees (as denoted by dashed lines 119, where such displacement is approximately 90 degrees within manufacturing tolerances) from sine stator 114. Resolver sensor 104 may resemble an electrical motor, except that excitation stator 112 does not induce an electrical current in rotor 110 to produce work (e.g., in the form of rotating rotor 110 about central axis 107) but to induce an electrical current in rotor 110 capable of being indirectly sensed by sine stator 114 and/or cosine stator 116. That is, excitation stator 112 may generate, via an analog excitation signal 111 produced by microcontroller 102, an electromagnetic field that induces a current in rotor 110. The current in rotor 110 may produce an electromagnetic field that induces a current in one or more of sine stator 114 and/or cosine stator 116.

Analog excitation signal 111 produced by microcontroller 102 and provided to excitation stator 112 may conform to a sine wave (or a cosine wave) or may conform to a pulse-width-modulated sine wave (or cosine wave), which may induce, via rotor 110, sine stator 114 to generate an analog sine signal 115 and cosine stator 116 to generate an analog cosine signal 117. Analog sine signal 115 may be out of phase by 90 degrees relative to analog cosine signal 117, which may allow microcontroller 102 to derive a current (although processing delay may be present and "current" may refer to a current position upon completion of processing analog sine signal 115 and analog cosine signal 117) angle and possibly velocity for resolver sensor 104 (which is, due to the mechanical attachment, such as a screw, a clamp, a bolt, or other removable fixture to rotating element 107 that is undergoing rotational movement). Although described with respect to a removable fixture, resolver sensor 104 may be permanently or semi-permanently attached to rotating element 106, such as by way of welding, adhesive, or the like, or some combination of removable and semi-permanent attachment to rotating element 106.

System 100 may be deployed in many different contexts to determine a current angle (or, in other words, angular position) of rotating element 106 about central axis 107, possibly a speed (or, in other words, angular velocity) of the rotating element 106 about central axis 107. System 100 may facilitate control of rotating element 106 in a larger control system in which the current angle or angular velocity may provide feedback for subsequent control of rotating element 106 (which may be attached to an electric motor, a traditional gas or fuel powered engine, servo, and the like, as well as computed in an electronic control unit (ECU) or other processing units). System 100 may, for example, be deployed within a vehicle (such as an automobile, motorcycle, bicycle including electric bicycles, farm equipment, military equipment, airplanes, aquatic vehicles, and the like), factories or other manufacturing centers, robotics, or any other context in which an angle or velocity of a rotating element 106 is required for monitoring or subsequent control of rotating element 106. In the automotive context, microcontroller 102 may, as one example, be integrated within an electronic control unit (ECU) or other type of control unit that observes an angular position or an angular velocity of an electric motor configured to drive an axel of a vehicle (e.g., an automobile) and thereby generate work in the form of rotating wheels for forward and/or backward movement.

In any event, microcontroller 102 may implement a Luenberger Observer (LO) resolver-to-digital converter (RDC) unit 122 ("LORDC 122"). LORDC 122 may implement, at least in part, an LORDC described in a paper by Krah, Jens O., et al., entitled "FPGA Based Resolver to Digital Converter Using Delta-Sigma Technology," published during the Proceedings of PCIM Europe 2006 (931), and dated May 1, 2006 (hereinafter the "LORDC paper"). As described in the LORDC paper, there is a preference to implement the LO algorithm to avoid having to compute an arctangent ("arctan") trigonometric function in software and/or dedicated hardware, which may present issues where signals 115 and 117 are identical (due to excitation signal 111). The LO algorithm may represent a tracking control loop algorithm that requires only a sine and cosine function instead of division and arctan function.

As further noted by the LORDC paper, there are a number of drawbacks to using an RDC chip. Some drawbacks include the high cost for the RDC chip, additional printed circuit board (PCB) space, limited performance given that the design of the RDC chip may have to be optimized for high motor speed and/or high resolution (which may improve accuracy of deriving the angle of rotating element 106), limited flexibility given that a fixed-point tracking loop bandwidth may be limited, no sine/cosine gain mismatch compensation, and/or phase lag due to the tracking loop (which may depend on the tracking loop bandwidth). As such, according to the LORDC paper, many LORDC implementations are designed for an FPGA or a CPU (or other general purpose processing circuitry). LORDC implementations, including the implementation discussed in the LORDC paper, may address some of these drawbacks of RDC chips, but may still rely on an FPGA to implement the LO algorithm.

However, despite the optimization issues and associated PCB space associated with an RDC chip (which may be integrated into processing circuitry), such RDC chips may improve the efficiency of computing the angle of rotating element 106 with little to no phase lag. Moreover, utilizing a CPU or other general-purpose processor to execute a software LO algorithm may consume processing cycles, memory, memory bus bandwidth, and other computing resources (along with associated power) that could otherwise be consumed by algorithms necessary for the overarching control of rotating element 106 and/or other components in which system 100 is integrated. Using an FPGA may result in additional monetary expense compared to an RDC chip, while also complicating the overall design of system 100.

In accordance with various aspects of the techniques described in this disclosure, microcontroller 102 may include a digital signal processor (DSP) 124 configured to implement LORDC 122 that provides a number of different configurable variables to potentially facilitate optimization of a LORDC implementation (e.g., LORDC 122). DSP 124 may represent a fixed-point DSP that performs single sample/single point data processing. In contrast to fixed-point arithmetic, where the bits are used to represent a certain value before and after the decimal point, floating-point arithmetic, uses a scientific representation where the bits represent mantissa and exponent that together represent the number. In contrast to floating-point hardware, fixed-point hardware is favorable for low-cost and low-power implementations with small chip area.

In contrast to fixed-point arithmetic, where the bits are used to represent a certain value before and after the decimal point, floating-point arithmetic, uses a scientific representation where the bits represent mantissa and exponent that together represent the number. Despite floating-point units being the maximum when it comes to precision, they have the disadvantage of larger area requirements, higher power consumption as well as possibly extra licensing costs. Therefore, fixed-point algorithms that serve the application well with limited precision are more appealing than high-precision floating-point algorithms that decrease the customer acceptance and increase the chip costs.

Furthermore, DSP 124 may include a limited size lookup table (LUT) 126 used to represent a cosine wave and a sine wave used for reference in observing (or otherwise computing or deriving) an approximate angle 131 ("angle 131") of rotating element 106 via resolver sensor 104, an angle error (AE) 133 of approximate angle 131 relative to an actual angle (based on signals 115 and 117), and a rotational velocity 135 ("velocity 135") of rotating element 106 via an acceleration signal (which may refer to a control signal used to control operation of rotating element 106). Even further limitation of the size of LUT 126 may cause an increase of a step size 127 between two values stored to subsequent LUT entries in LUT 126, thereby decreasing the accuracy in determining a cosine of angle 131 and a sine of angle 131, which may also result in accumulated error in observing angle 131 over time. This accumulated error may be further increased due to fixed-point implementations, which may result in limitations on value size, possibly resulting in saturation (where an actual value exceeds the fixed-point representation but is limited to the highest number possible due to the fixed number of bits). That is, such saturation may further increase the accumulated error in the observation of angle 131 when such values exceed the fixed number of bits.

To address the inherent limitations of fixed-point DSP 124 and the limited size of LUT 126, LORDC 122 may be configured with a configurable step size 127 for LUT 126 that is balanced by exposing a configurable wrap gain (G$_W$) 129. Decreasing step size 127 may increase consumption of memory dedicated for LUT 126 given that more entries may be required with a smaller step size. In contrast, G$_W$ 129 may allow for optimization that improves the accuracy of wrap around, which refers to wrapping around a value computed for each of the cosine and sine of angle 131 considering that the cosine and sine functions have a period of two (2) multiplied by pi (π). That is, the function repeats cyclically after multiples of 2 multiplied by pi (π). In LO implementations, LORDC 122 may estimate angle 131 by integrating velocity 135, which may eventually result in an infinite angle. The integrator of LORDC 122 may overflow (before the integrated velocity 135 reaches infinity), which may result in a phase error due to the value of integrated velocity 135 not possibly representing 21.

By exposing configurable step size 127 and G$_W$ 129, a designer of LORDC 122 may optimize application of LO to determine approximate angle 131 in a manner that accommodates both fixed-point limitations associated with fixed-point DSP 124 and a limited size for LUT 126. Step size 127 may allow for various different implementations for storing a quarter (¼), a half (½), or a full (1) representation of the cosine and sine values of approximate angle 131 to tailor accuracy while balancing memory consumption, where a quarter representation may allow for a smaller step size compared to a half representation or a full representation and a half representation may allow for a smaller step size compared to a full representation. Selecting step size 127 may allow the designer to balance the limited size of LUT 126 in view of timing and accuracy and/or precision requirements of a given implementation of LORDC 122. G$_W$ 129 may further allow the designer to balance the limited size of LUT 126 in view of timing, and accuracy and/or precision requirements of a given implementation of LORDC 122.

In operation, DSP 124 may include a fixed size LUT 126 having a fixed number of LUT entries that store either discrete cosine values over a set of stepped angles and/or discrete sine values over the set of stepped angles. Dedicated DSP 124 may derive both discrete sine values or discrete cosine values from respective discrete cosine values over the set of stepped angles or discrete sine values over the set of stepped angles. As such, both, sine and cosine values might originate from the same set of values stored in LUT 126, and hence, are discriminated into sine and cosine values by means of post-processing the values from LUT 126 by algorithmic means in DSP 124. Dedicated DSP 124 may perform fixed-point mathematical operations that adhere to a fixed bit width (hence, DSP 124 being representative of a fixed-point DSP).

As further shown in the example of FIG. 1, microcontroller 102 may include a delta-sigma (DS) analog-to-digital converter (ADC) 144 ("DSADC 144") communicatively coupled to fixed-point DSP 124 and electrically coupled to resolver sensor 104 attached to rotating element 106 controlled by microcontroller 102. DSADC 144 may include a carrier generator 146, ADC channel A 148A ("ADC CH A 148A"), and ADC channel B 148B ("ADC CH B 148B"). Carrier generator 146 may represent a hardware unit configured to generate a carrier (such as a sine wave or cosine wave) at a configurable gain, which is output to excitation stator 112. The carrier signal output to the excitation stator 112 may be pulse-width-modulated.

ADC channel A 148A may represent a hardware unit configured to convert analog sine wave 115 produced (through induction) by sine stator 114 to digital sine values 145, while ADC channel B 148B may represent a hardware unit configured to convert analog cosine wave 117 produced (through induction) by cosine stator 116 to digital cosine values 147. ADC channel A 148A may output each sine value of digital sine values 145 to LORDC 122 for processing, while ADC channel B 148B may output each cosine value of digital cosine values 147 to LORDC 122 for processing. LORDC 122 may process each individual value (or, in other words, each sample) of digital sine values 145 and digital cosine values 147 prior to processing the next value of digital sine values 145 and digital cosine values 147 given that DSP 124 implements LORDC 122 to perform single sample/single data point processing.

LORDC 122 may obtain, based on the digital sine value 145 (which is another way to refer to a given value of digital sine values 145) and digital cosine value 147 (which is another way to refer to a given value of digital cosine value 147), and via the fixed-point mathematical operations, approximate angle 131 (and possibly approximate velocity 135) of rotating element 106. LORDC 122 may also obtain, as a result of performing the tracking control loop consistent with the LO algorithm, angle error 133. LORDC 122 may perform this tracking control loop to identify an approximate digital sine value of approximate angle 131, and an approximate digital cosine value of approximate angle 131, which may be compared to digital sine value 145 and digital cosine value 147, thereby allowing LORDC 122 to determine angle error 133.

System 100 may also determine an acceleration value, which LORDC 122 may obtain (via control logic not shown in the example of FIG. 1) when determining a velocity 135, which is used in computing angle 131. LORDC 122 may also output velocity 135 to provide another indication that microcontroller 102, system 100, or any other component of external control loops may use for controlling rotation of rotating element 106.

DSADC 144 may output digital sine value 145 and digital cosine value 147 without adjusting one or more of digital sine value 145 and digital cosine value 147 by sign inversion, rectification, multiplication of the carrier signal or any other method of demodulation of resolver-induced amplitude modulation. Each of ADC CH A 148A and ADC CH B 148B may expose a configurable gain ($G_{ADC}$ 149A and 149B, respectively) by which gain compensation may be performed by setting $G_{ADC}$ 149A and 149B to different values. Exposing $G_{ADC}$ 149A and 149B as configurable gains may also facilitate another variable that the designer may control to design system 100 to meet stated performance requirements in terms of memory size, timing, and precision. $G_{ADC}$ 149A and 149B may have a power of two (2) for reasons discussed in more detail below.

In this way, various aspects of the techniques may enable a fixed-point, limited memory DSP 124 to accommodate different requirements for memory size, timing (e.g., limiting phase delay), and precision for estimating approximate angle 131 of rotating element 106, while possibly maintaining the inherent benefits of a LORDC implementation. Such benefits of the LORDC implementation may include reduced computing resource utilization (in terms of execution cycles, memory, and memory bus bandwidth utilization along with associated power consumption) while abstaining from utilizing additional components that may increase the complexity and possibly the monetary cost of motor/engine control systems. As such, various aspects of the LORDC optimization techniques may improve operating of LORDC system 100 itself.

Figure 2A:
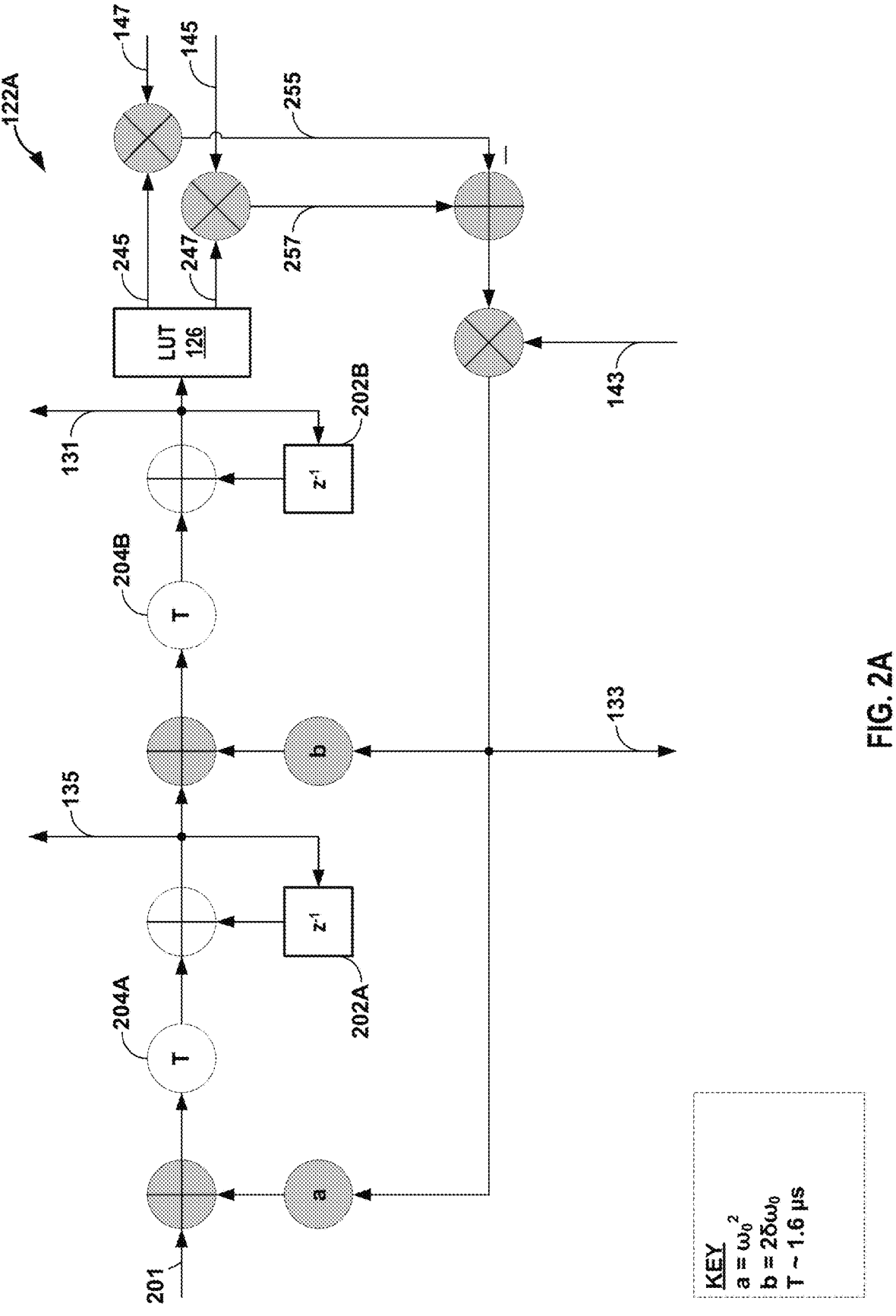
FIGS. 2A-2C are diagrams illustrating the Luenberger Observer (LO) resolver-to-digital converter (RDC) of FIG. 1 in more detail as optimized in accordance with various aspects of the RDC optimization techniques described in this disclosure.
Figure 2B:
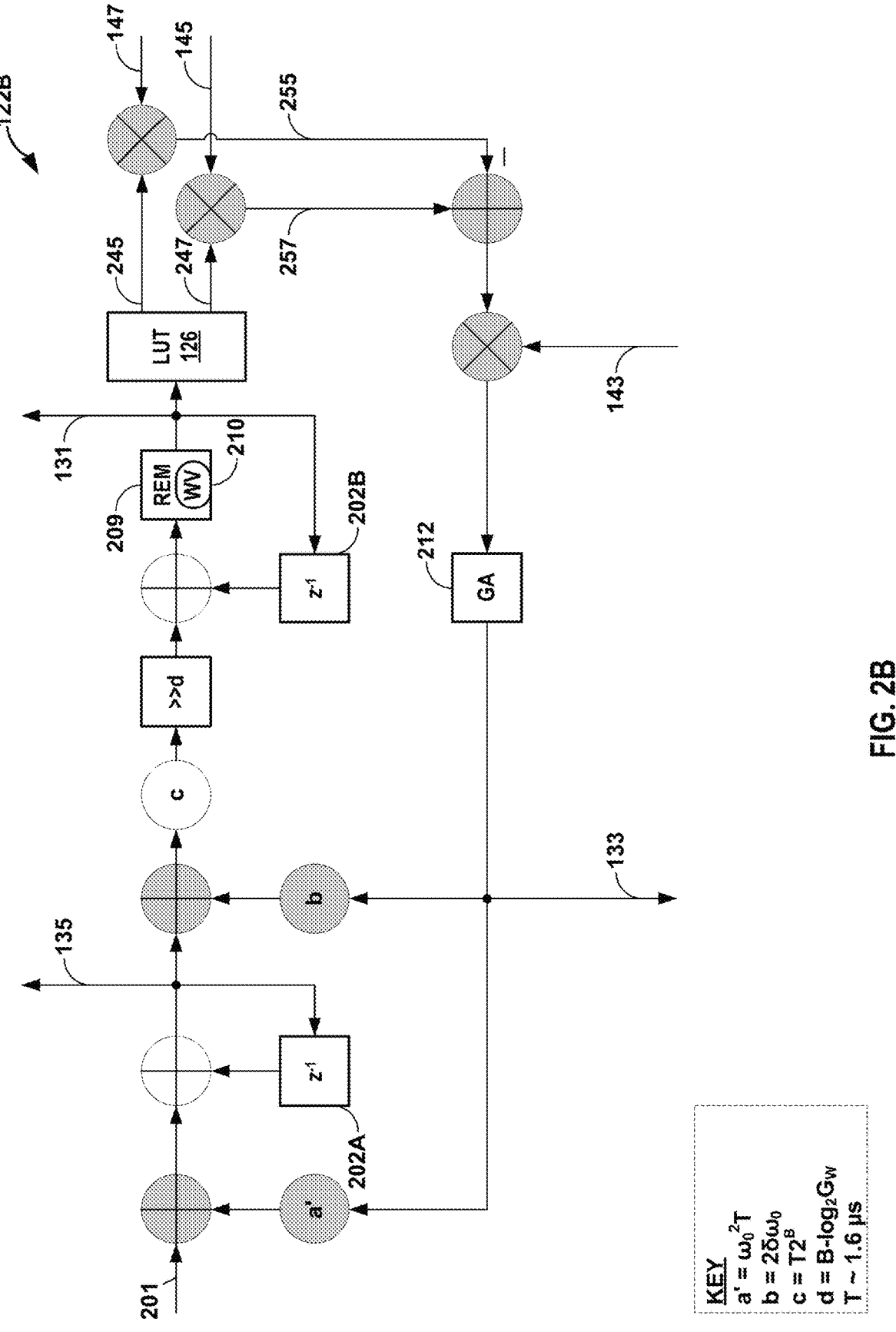
Figure 2C:
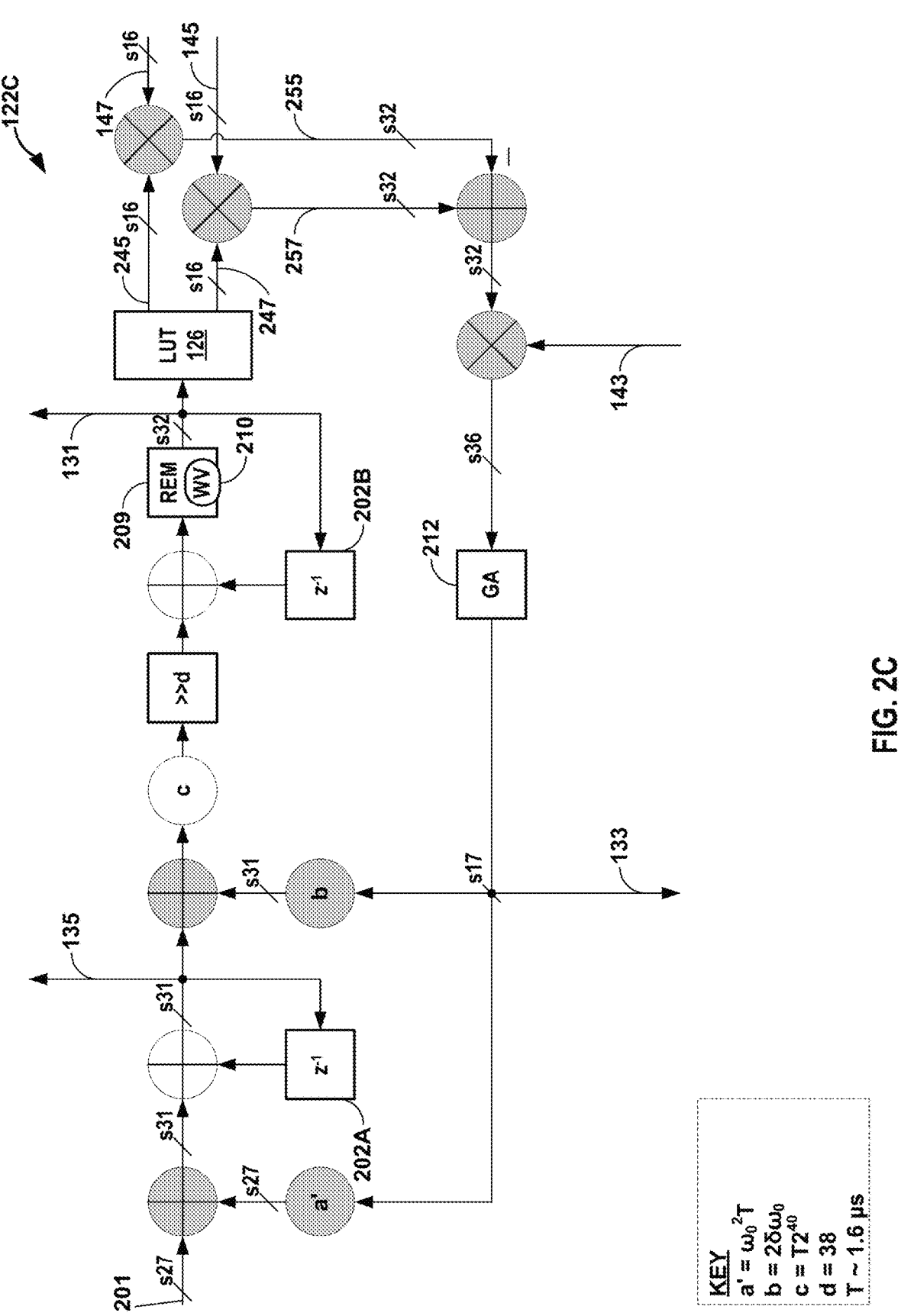

FIGS. 2A-2C are diagrams illustrating the Luenberger Observer (LO) resolver-to-digital converter (RDC) of FIG. 1 in more detail as optimized in accordance with various aspects of the RDC optimization techniques described in this disclosure. As shown first in the example of FIG. 2A, optimization of the LORDC paper to accommodate a fixed-point implementation of the LORDC (denoted as a LORDC 122A to denote that the example of FIG. 2A shows an intermediate optimization of LORDC 122 shown in the example of FIG. 1) may begin by transitioning from continuous analog-signal-based integrators into discrete digital-signal-based integrators 202A and 202B and the adjacent sampling time (T) 204A and 204B.

In the example of FIG. 2A, each component/operation shown in grey refers to existing components/operations presented first in the LORDC paper referred to above. As noted in the LORDC paper, LORDC 122A implements a tracking observer loop, which begins by obtaining discrete digital carrier value 143, discrete digital sine value 145, discrete digital cosine value 147, and an acceleration 201 (which may also be referred to as "discrete digital acceleration value 201"). As time (which is measured in processing cycles) progresses, LORDC 122A outputs approximate angle 131, angle error 133, and velocity 135, each of which is a discrete (meaning single sample) digital value for each of approximate angle 131, angle error 133, and velocity 135.

The tracking observer loop begins with states 202A and 202B being initialized to zero (0). LORDC 122A receives discrete digital sine value 145 and discrete cosine value 147 (along with discrete digital carrier value 143 and acceleration 201). LORDC 122A may begin with states 202A and 202B being initialized to zero (0), resulting in LUT 126 outputting sine value 245 of approximate angle 131 (equal or close to zero) and cosine value 247 of approximate angle 131 (equal or close to zero). LUT 126 may divide approximate angle 131 (initialized to zero) by step size 127, using the result as a key (in which case LORDC 122A may access LUT 126 based on approximate angle 131) to access one or more LUT entries of LUT 126 to output sine value 245 and cosine value 247.

LORDC 122A may multiply sine value 245 by cosine value 147, resulting in a first intermediate value 255. LORDC 122A may multiply cosine value 247 by sine value 145, resulting in a second intermediate value 257. First intermediate value 255 and second intermediate value 257 may respectively represent a first version of approximate angle 131 and second version of approximate angle 131. LORDC 122A may subtract first intermediate value 255 from second intermediate value 257 to obtain approximate angle error 133 (after multiplication by discrete digital carrier value 143 to achieve a demodulation of the amplitude-modulated digital sine 145 and digital consine 147).

LORDC 122A may provide approximate angle error 133 to 'a' and 'b', which are defined as follows (and as shown in the "KEY" of FIG. 2A):

$$a = \omega_0^2; \text{ and}$$

$$b = 2\delta\omega_0.$$

In this instance, $\omega_0$ may represent a bandwidth of LORDC 122A, defined as $2\pi f_0$, where $f_0$ equals a base frequency (and, per the LORDC paper, the bandwidth may be set in the area of 1000 Hertz-Hz). The variable $\delta$ may denote the damping factor, which may be set to approximately 0.5 (per, the LORDC paper reference above).

LORDC 122A may obtain a result of multiplying 'a' and approximate angle error 133, where the result of multiplying 'a' and approximate angle error 133 is added to acceleration value 201. In transitioning from analog to digital processing, LORDC 122A may add a multiplication factor (T) 204A ("T 204A") that is approximately equal to the sampling period of LORDC system 122A and possibly DSP 124 (where T 204A is small and is equal to approximately 1.6 microseconds-1.6 μs). LORDC 122A may add velocity 135 to a result of multiplication of 'b' by approximate angle error 133. LORDC 122A may include another multiplication factor (T) 204B ("T 204B") as another result of transitioning LORDC 122A from the analog domain to the digital domain with the inclusion of integrator 202B. The result of integrator 202B (which integrates the result of adding the multiplication of 'b' by approximate angle error 133 to velocity 135 over T 204B) may represent approximate angle 131. LORDC 122A may output approximate angle 131, while also using approximate angle 131 as an input to LUT 126.

Responsive to receiving approximate angle 131, LUT 126 may again access, based on approximate angle 131 (and possibly step size 127), one or more LUT entries of LUT 126 to output sine value 245 and cosine value 247. LORDC 122A may continue in this manner via the tracking observer loop to generate approximate angle 131, approximate angle error 133, and velocity 135 based on discrete carrier value 143, discrete sine value 145, discrete cosine value 147, and acceleration value 201.

Referring next to the example of FIG. 2B, an LORDC 122B represents a further optimization of LORDC 122A shown in the example of FIG. 2B. In order to speed up execution time and optimize LORDC 122 and 122A for fixed-point implementation, LORDC 122B or designer of LORDC 122B may multiply the arguably very small coefficient T before first integrator 202A in LORDC 122A by 'a' resulting in a', which is defined as follows:

$$a' = \omega_0^2 T.$$

As shown in the example of FIG. 2B, LORDC 122B also includes a new coefficient 'c' before second integrator 202B as well as right shift by coefficient 'd'. This optimization provided by LORDC 122B may result in:

$$c2^{-d} = T2^B 2^{-(B-log_2 G_W)} = T2^B 2^{-B} 2^{log_2 G_W} = TG_W.$$

Given that T is very small, and $G_W$ is not large (e.g., 4), multiplying the numbers of T and $G_W$ may result in quantization (or, in other words, rounding) error. Also multiplying the input with T first and then $G_W$ may result in large quantization error. These quantization errors may appear as an offset in the estimation of velocity 135. In order to multiply with T in an optimal manner, a multiply-shift approach is deployed in 122B, whereby T is multiplied with $2^B$ (product being coefficient 'c') and afterwards shifted right by B bits, where B is selected in accordance what a HW accumulator might provide, or otherwise, in a way that the quantization error is sufficiently small. Since $G_W$ is a factor that would be applied afterwards, it can be accounted for in the bit shift, resulting in $d = B - log_2 G_W$.

To better optimize $G_W$ for LORDC 122B, a designer may perform the following:

1. In some ADCs, the maximum amplitude or full-scale value is configurable (such as DSASC 144 shown in the example of FIG. 1). The designer may define a range of full-scale values (amplitude_range) that satisfies the performance needs. This means that A_ADC∈[A_L, A_H], whereby A_L denotes the lower end and A_H denoted the higher end. 2. Define a range of 2π wrap values (wrap_value_range) whereby $W_L$ denotes the lower end and $W_H$ denotes the higher end. For selection, consider the following:

A wrap value smaller than the ADC amplitude*2π will eventually result in a loss of precision. As such, $W_L = A_L * 2\pi$.

The register of the second integrator will have a certain bit width. The maximum value $B_{MAX}$ according to the bit width is the physical upper end of the wrap value. It may be beneficial to not utilize this range completely since an integrating element may require some headroom. In this instance, $W_H = B_{MAX} - h$, whereby h is a value that is chosen so that the register bit width requirement is not violated, and one additional input scaled by $G_W$ is guaranteed not to overflow the register. The use of saturating integrators is recommended.

3. The memory of LUT 126 is limited and there is some angle precision requirement that has to be held. Define an angle_step_range [$S_L$, $S_H$] in degree or rad respectively and consider the following aspects:

The smaller the angle step (represented by step size 127), the closer the estimated system states to the actual system states. Hence, more precise velocity 135 and angle 131 output. On the other side, the memory of LUT 126 is limited. The smaller the angle step 127 (which is another way to refer to step size 127), the more entries in LUT 122 are necessary, the more memory is needed to represent the wave form.

The larger angle step 127, the worse the resolution of the waveform. The control loop will regulate the imprecise estimations over time. But local errors of the velocity 135 and angle 131 will be increasing, the larger angle step 127 is getting.

4. Define a tolerance (tol) that will be used to judge if the deviation of the actual gain value $G_{W,F}$ from its rounded version $G_W$ is acceptable or not. After all, given a fixed-point implementation, $G_W$ will be used in the implementation, not $G_{W,F}$.

5. Define an upper bound for the gain $G_W$ that is acceptable for the given implementation to not cause an overflow or saturation. Here the variable is denoted $G_{W,MAX}$.

6. Define the memory requirement: $B_{LUT}$ defines how much bytes the LUT is allowed to take.

7. Define how much bytes each entry of LUT 126 requires. This value is related to the amplitude of the sine and cosine that the LUT algorithm is generating.

8. Define M depending on how much of a wave is stored in LUT 126:

M=4 if a quarter wave is stored in the LUT or

M=2 if a half wave is stored in the LUT or

M=1 if a full wave is stored in the LUT. 9. Divide each of the wrap values in wrap_value_range by M. If the division remainder is 0, consider this set of wrap values the new candidates.

10. Take the new candidates and divide them by each step. Steps are in the range from floor (wrap_value*$S_L$/360) to ceil (wrap_value*$S_H$/360) or floor (wrap_value*$S_L$) to ceil (wrap_value*$S_H$), respectively for steps in degree or rad. If the division remainder is 0, consider this set of wrap values the new candidates. Step 9 and 10 assure that the construction of whole waves with partial wave information from and by LUT 122 is possible without phase errors.

11. For each amplitude in amplitude_range:

11.1. Calculate the exact gain $G_{W,F}$ that is necessary to scale amplitude*2π to each wrap_value candidate.

11.2. Calculate the rounded gain $G_W$ from $G_{W,F}$ for each wrap_value candidate.

11.3. Calculate the absolute error between $G_{W,F}$ and $G_W$. It indicates how large will be the phase error caused by imprecise representation of 2π.

11.4. Calculate the number of bytes necessary to store the quarter (M=4), half (M=2), or full (M=1) wave content. $B_{ENTRY}$ is the number of bytes per LUT entry.

12. Consider the wrap value candidates if . . .

the absolute error does not exceed the tolerance (tol) and the gain $G_W$ does not exceed a predefined maximum gain $G_{W,MAX}$ (based on e.g., hardware bit shifter limitations) and the number of bytes necessary in LUT 126 does not exceed the (possibly limited) number of bytes in LUT 126 (denoted as $B_{LUT}$).

To illustrate an example, consider a wrap value candidate 210 with a value of 160416. Such wrap value candidate may have the smallest error of 2.5e-8. This wrap value candidate has a relatively fine step size of 0.08 deg, which is represented by 160416*0.08/360=ca. 36. The amplitude candidate may, as one example, be 25531, where the wrap gain $G_W$ is 1, and LUT 122 requires 2228 bytes. This results in the following:

amplitude*$2\pi$*$G_W$=25531*$2\pi$*1=160416.004077602 wrap_value/M/step=160416/4/36=1114

This are 2228 bytes if each entry requires 2 bytes.

However, there are also other wrap value candidates 210 with finer step size granularity, e.g., 161880 and 644504, but these wrap value candidates require more memory for LUT 122. The example above delivers thirteen (13) unique candidates, and 30 wrap value/amplitude combinations. Since there are more aspects that play a role in the overall precision (e.g., implementation details), the designer should simulate each combination and assess the behavior of the steady state oscillations at velocity output (e.g., velocity 135). In this part, the designer may optimize LORDC 122B to minimize error of velocity 135 and the error of angle error 131 induced by the phase error caused by an imprecise $2\pi$ wrap value as well as avoiding phase errors introduced by imprecise step sizes 127 in LUT 126.

In addition, there are three frequently used ways to implement a sine and cosine function:

1. Taylor series

2. CORDIC

3. Look-Up table (LUT) (e.g., LUT 126)

The drawback of the Taylor series and CORDIC implementations is the dependency of the precision on the number of iterations, which may be computationally expensive. The generation with the help of the Taylor series and the CORDIC takes multiple iterations, but additionally, the CORDIC needs one or more lookup tables.

Considering these drawbacks, it may be fastest and smallest to store the wave information in LUT 126 and reading LUT 126 with a non-iterative algorithm. This is the third option and due to the potential benefits, LORDC 122B may include LUT 126. Within the LUT algorithm we consider following aspects:

Amplitude of sine and cosine;

Content to be stored in LUT 126; and

Algorithm to construct the sine and cosine (e.g., from a quarter or half wave).

Because LORDC 122B represents a fixed-point implementation, the amplitude of discrete sine 245 and discrete cosine 247 may depend on the output bit width of LUT 126. This bit width can be utilized or not. One advantage of not fully utilizing the bit width is that the bit width growth in the tracking loop is limited and less bits have to be discarded for balancing the bit growth. However, an error is introduced by deliberately limiting the amplitude of the sine and cosine.

In the example shown in FIG. 2B, the precision of the comparison of estimated angle 131 (which is another way to refer to approximate angle 131) and the angle information from the ADC (e.g., digital sine value 145 and digital cosine value 147) is also determined by LUT 126. If, for example, LUT 126 is having duplicate entries due to quantization from bit width limitations, the high-quality estimated angle may lose precision, which may impact velocity 135. In this instance, the step size 127 is chosen in a way that the amplitude would need to be 328281 in order to store a set of unique values in LUT 126. A LUT with the needed bit width of 20 bits is, in this instance, very unlikely to be implemented, and usually is not worth the costs for a larger LUT. In another instance, when the sine and cosine output 245/247 is quite small, the settled area of the velocity output may be quite busy since the tracking observer loop has to regulate for the imprecise sine and cosine output 245/247 by elevated angle error 133. The larger the amplitude of LUT 126, the smaller the local velocity error will be. In this instance, when the amplitude is 2048, for example, the error is 0.85 radian per second ("rad/s"). The error is 0.11 rad/s when the amplitude is 32768, and the error is 0.06 rad/s, when the amplitude is 328281.

In some examples, there is potential benefits when the amplitude is 328281, which may minimize the local velocity error. However, an amplitude of 328281 may require 20 signed bits. Multiplication with the 16-bit signed LO input sine or cosine signal 147/145 will result in a maximum of 35 bits. This may be too much for a usual word of 32 bits. If the DSP (e.g., DSP 124) does not offer a double word precision, this may be a costly operation with hardware accumulators or self-implemented double word arithmetic. The trade-off is to accept some velocity error to have a fast multiplication by not exceeding 32 bits. Moreover, intermediate gain adjustments are not favorable since the angle error may lose precision. It may be beneficial to have an amplitude near to a power of 2, since the amplitude of LUT 126 may be seen as gain on angle error 133 that may require adjustment over time. As such, a power of 2 may enable implementation to deploy bit shifters. In this instance, the LUT 126 amplitude may be set to 32767.

To optimize amplitude of LUT 126, the following may be considered:

1. Select an amplitude close to one of digital sine 145 and digital cosine 147; and 2. Select an amplitude that is a power of 2 such that the gain of LUT 126 can be easily adjusted later.

Considering a data memory of 3 KB for LUT 126, the designer may keep some margin in memory consumption, and may elect to use 2.8 KB for LUT 126. A LUT size of 2800 bytes means the number of 16-bit entries is 1400. This is the limit the memory is providing for storing the sine and the cosine values (output as sine value 245 and cosine value 247). For one of the sine and cosine waves, LUT 126 may store 700 LUT entries (each 32 bits). Having 700 LUT entries over 360 degree means an angle resolution of ca. 0.52 degree. This angle resolution may violate the angle error requirements (not at the output but already internally).

In order to utilize the memory even further, LUT 126 may store a single half wave and construct, both, sine and cosine out of it. This means 1400 entries (each 16 bit) store a half wave: 180/1400=0.13 degree. Finally, the sine and cosine can also be constructed from a single quarter wave: 90/1400=0.0643 degree.

In this example, the designer may not utilize all of the memory allocated to LUT 126, because wrap value (WV) 210 ("WV 210") and step size 127 as described above. For example, wrap value 210 may be configured as 160416 with a step size 127 configured to be 0.08 deg (36). This results in 160416/4/36=1114 entries for a quarter wave. To optimize LUT 126, the following may be performed:

Calculate the first quarter of a wave and store it in LUT 126:

a. If the decision was made for half-word LUT values and DSP 124 allows for half-word access, a possible most efficient way is to store two LUT values in one word. If DSP 124 does not allow for reading half-word values from one word, a whole word must be used for one LUT value.

b. If the decision was made for a LUT value larger than a half word but less equal to a word, the whole word has to be used for one LUT value.

c. If the decision was made for a LUT value larger than a word, it has to be assured that the timing requirements of the LORDC 122 are met since double- or even multi-word arithmetic operations would be required.

LUT 126 may derive the sine and cosine wave values from a single sine wave representation in the LUT entries or a single cosine wave representation in the LUT entries. Alternatively, LUT 126 may store both the sine and the cosine wave values in separate respective LUT entries or in combined LUT entries (where both sine and cosine wave values are stored to the combined LUT entries).

In this respect, LUT 126 may produce sine and cosine values in accordance with the following pseudocode:

$$
\begin{aligned}
&\text{If } \theta_{est} < 0 \\
&\quad S_{sin} = -1 \\
&\quad \theta_{est} = \mathrm{abs}(\theta_{est}) \\
&\text{Else} \\
&\quad S_{sin} = 1 \\
&\text{If } \theta_{est} >= 3*\pi/2 \\
&\quad S_{sin} = -S_{sin} \\
&\quad S_{cos} = 1 \\
&\quad \theta_{est} = \theta_{est} - 3*\pi/2 \\
&\quad N_{sin} = L_{LUT} \\
&\quad N_{cos} = 0 \\
&\text{elseif } \theta_{est} >= \pi \\
&\quad S_{sin} = -S_{sin} \\
&\quad S_{cos} = -1 \\
&\quad \theta_{est} = \theta_{est} - \pi \\
&\quad N_{sin} = 0 \\
&\quad N_{cos} = L_{LUT} \\
&\text{elseif } \theta_{est} >= \pi/2 \\
&\quad S_{cos} = -1 \\
&\quad \theta_{est} = \theta_{est} - \pi/2 \\
&\quad N_{sin} = L_{LUT} \\
&\quad N_{cos} = 0 \\
&\text{else} \\
&\quad S_{cos} = 1 \\
&\quad N_{sin} = 0 \\
&\quad N_{cos} = L_{LUT} \\
&\text{where,} \\
&\quad P_{raw} = \theta_{est}/\text{step} \\
&\quad P_{sin} = \mathrm{abs}(N_{sin} - P_{raw}) \\
&\quad P_{cos} = \mathrm{abs}(N_{cos} - P_{raw}) \\
&\quad OUT_{sin} = S_{sin} * LUT(P_{sin}) \\
&\quad OUT_{cos} = S_{cos} * LUT(P_{cos})
\end{aligned}
$$

In the above, the following occurs:

1. There is the first quarter of sine wave stored in the LUT.
2. With the help of the quarter wave, we want to reconstruct a whole sine and a whole cosine wave.
3. The LUT content can be flipped horizontal by changing the direction of read-out ("count down") and flipped vertically by inverting the sign.
4. In order to count up but still count down, the index is subtracted from a modifier. The modifier is 0 if counting up and it is N when counting down. N is the number of entries in the LUT. For example: if the $3^{rd}$ element counting up is needed, abs(0-3)=3 will be the index taken. In contrast, if the $3^{rd}$ element from the back is needed, abs(N-3) will be the index taken.

In the example of FIG. 2B, LORDC 122B includes a remainder operation (REM) 209 ("REM 209"), which may map angle 131 into the representation of $-2\pi$ to $2\pi$. Although described with respect to REM 209, LORDC 122B may replace REM 209 with a modulo operation (denoted as "MOD") that maps angle 131 into the range of 0 to $2\pi$. REM 209 may apply the remainder operation based on WV 210, which is configured and/or optimized in the manner described above.

LORDC 122B also includes a gain adjustment (GA) 212 ("GA 212"). In order to adjust the gain caused by carrier 143 and the gain caused by the LUT sine and cosine amplitude (values 245/247), LORDC 122B includes GA 212 in the feedback path that adjusts the gain of angle error 133.

In the example of FIG. 2C, LORDC 122C may represent an optimized implementation of LORDC, which includes bit widths defined in terms of signed bits ("s") followed by the number of bits (e.g., 16, 17, 31, 32, 36, and the like). The addition operations to add acceleration 201 to the result of multiplying a' by angle error 133 and velocity 135 to the result of multiplying 'b' by angle error 133 may be saturated. The value of B is set to 40, while $G_W$ is set to 4 (where $40 - \log_2(4) = 38$, resulting in d=38). c is configured as equal to $T2^{40}$.

FIG. 3 is a flowchart illustrating example operation of the microcontroller of FIG. 1 in performing optimized resolver-to-digital conversion in accordance with various aspects of the techniques described in this disclosure. As described above, microcontroller 102 may include a DSP 124, which may include a fixed size LUT 126 having a fixed number of LUT entries that store discrete cosine values over a set of stepped angles and discrete sine values over the set of stepped angles. Dedicated DSP 124 may perform fixed-point mathematical operations that adhere to a fixed bit width/bandwidth. Signal 111 may be produced by on-chip carrier generator 146, which is a pulse-width-modulated version of signal 143 going to an off-chip "power stage."

Microcontroller 102 may include a delta-sigma (DS) analog-to-digital converter (ADC) 144 ("DSADC 144") communicatively coupled to fixed-point DSP 124 and electrically coupled to resolver sensor 104 attached to rotating element 106 controlled by microcontroller 102. DSADC 144 may include a carrier generator 146, ADC channel A 148A ("ADC CH A 148A"), and ADC channel B 148B ("ADC CH B 148B"). Carrier generator 146 may represent a hardware unit configured to generate a carrier (such as a sine wave or a cosine wave) at a configurable gain, which is output to excitation stator 112. The carrier signal output to excitation stator 112 may be pulse-width-modulated.

ADC channel A 148A may represent a hardware unit configured to convert analog sine wave 115 produced (through induction) by sine stator 114 to digital sine values 145, while ADC channel B 148B may represent a hardware unit configured to convert analog cosine wave 117 produced (through induction) by cosine stator 116 to digital cosine values 147. In this respect, DSADC 144 may obtain a digital cosine value 147 for an indirectly sensed angle of rotating element 106 and a digital sine value 145 for the indirectly sensed angle of rotating element 106 (300). ADC channel A 148A may output each sine value of digital sine values 144 to LORDC 122 for processing, while ADC channel B 148B may output each cosine value of digital cosine values 147 to LORDC 122 for processing. LORDC 122 may process each individual value (or, in other words, each sample) of digital sine values 145 and digital cosine values 147 prior to processing the next value of digital sine values 145 and digital cosine values 147 given that DSP 124 implements LORDC 122 to perform single sample/single data point processing.

LORDC 122 may obtain, based on the digital sine value 145 (which is another way to refer to a given value of digital sine values 145) and digital cosine value 147 (which is another way to refer to a given value of digital cosine value 147), and via the fixed-point mathematical operations, approximate angle 131 (and possibly angular velocity 135) of rotating element 106 (302). LORDC 122 may also obtain, as a result of performing the tracking control loop consistent with the LO algorithm, AE 133. LORDC 122 may perform this tracking control loop to identify an approximate digital sine value of approximate angle 131, and an approximate digital cosine value of approximate angle 131, which may be compared to digital sine value 145 and digital cosine value 147, thereby allowing LORDC 122 to determine AE 133. System 100 may also determine an acceleration value, which LORDC 122 may obtain (via control logic not shown in the example of FIG. 1) when determining a velocity 135, which is used in computing angle 131. LORDC 122 may also output velocity 135 to provide another indication that microcontroller 102 may use for controlling rotation of rotating element 106. In this way, LORDC 122 may output approximate angle 131 (as well as AE 133 and/or velocity 135) to facilitate control and/or monitoring of rotating element 106 (304).

Figure 4:
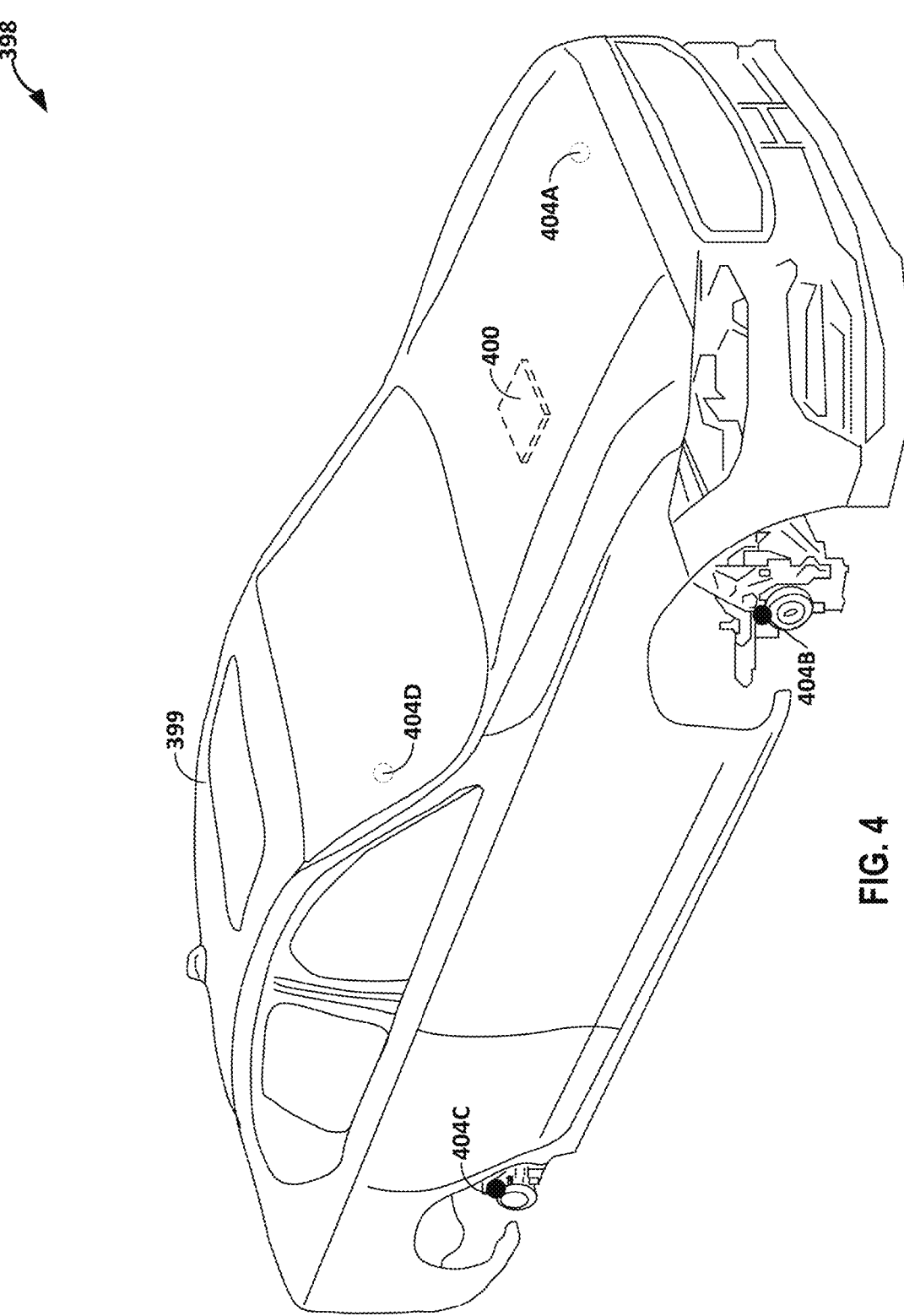
FIG. 4 is a diagram illustrating an example system configured to perform various aspects of the optimized resolver-to-digital converter techniques described in this disclosure.

FIG. 4 is a diagram illustrating an example system configured to perform various aspects of the optimized resolver-to-digital converter techniques described in this disclosure. Although shown as an automobile in the example of FIG. 4, vehicle 399 may represent any type of vehicle, including an automobile, a truck, farm equipment, a motorcycle, a bike (including electronic bikes), a scooter, construction equipment, a semi-truck, an airplane, a helicopter, a military vehicle, or any other type of vehicle capable of implementing various aspects of the secure external storage techniques described in this disclosure.

As further shown in the example of FIG. 4, vehicle 399 includes a computing system 400 (which may represent one example of microcontroller 102 shown in the example of FIG. 1) and a plurality of sensors 404A-404D ("sensors 404"). Computing system 400 and some of sensors 404 are shown in the example of FIG. 4 using dashed lines to denote that computing device 400 and sensors 404 may not be visible or are otherwise integrated within vehicle 399.

Computing system 400 may include one or more electronic control unit (ECUs) and a computing device. For example, computing system 400 may include an ECU configured to control an electric motor, anti-lock braking systems (ABS, which may also control traction control—TC), an ECU configured to control the Electronic Stability Control (ESC) system, and a main ECU acting as the computing device to direct operation of all of the systems (including those not listed in this example). Generally, an ECU includes a microcontroller, and memory (such as one or more of static random access memory-SRAM, electrically erasable programmable read-only memory-EEPROM, and Flash memory), digital and/or analog inputs, digital and/or analog outputs (such as relay drivers, H bridge drivers, injector drivers, and logic outputs).

In some examples, rather than utilize an ECU as the computing device, computing system 400 may include a relatively more powerful processor (compared to the microcontroller) configured to execute instructions or other forms of software to perform various aspects of the techniques described in this disclosure. The processor may represent one or more of fixed function, programmable, or combinations thereof, such as microprocessors, digital signal processors (DSPs), application specific integrated circuits (ASICs), field programmable gate arrays (FPGAs), discrete logic, software, hardware, firmware or any combinations thereof. When the techniques are implemented partially in software, computing system 400 may store instructions for the software in a suitable, non-transitory computer-readable medium (e.g., external NVM system 204 shown in the example of FIG. 2) and execute the instructions in hardware using one or more processors to perform the techniques of this disclosure. A device including computing system 400 may comprise an integrated circuit, and/or a microprocessor.

For purposes of illustration, computing system 400 is assumed to represent a processor communicatively coupled to one or more ECU responsible for controlling operation of the electric motor that drives axels and thereby results in movement of vehicle 399. Sensors 404A-404D may represent examples of resolver sensor 104 configured to sense wheel speed at the wheels of vehicle 399 (although the wheels are not shown so as to illustrate an approximate location of sensors 404B and 404C), and as such may be referred to as "wheel speed sensors 404."

The ECU may be communicatively coupled to the wheel speed sensors 404 and operate as described above with respect to microcontroller 102 to obtain an approximate angle of the axel to which sensors 404 are attached or otherwise affixed. The ECU may determine this angle in order to control acceleration or deceleration of rotating element 106, which in this example is assumed to be an axel. Using this angle, the ECU may control the electric motor to speed up, slow down, or maintain the current rotational speed of electric motor and thereby move vehicle 399.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carriers, signals, or other transitory media, but are instead directed to non-transitory, tangible storage media. Disk and disc, as used herein, includes compact disc (CD), laser disc, optical disc, digital versatile disc (DVD), and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable gate arrays (FPGAs), complex programmable logic devices (CPLDs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

In this respect, one or more aspects of the techniques may enable the following examples:

Example 1. Processing circuitry comprising: a delta-sigma analog-to-digital converter communicatively coupled to a fixed-point digital signal processor and electrically coupled to a resolver sensor attached to a rotating element controlled by the processing circuitry, the delta-sigma analog-to-digital converter configured to obtain, based on electrical interactions with the resolver sensor, a digital cosine value for an indirectly sensed angle of the rotating element and a digital sine value for the indirectly sensed angle of the rotating element; and a fixed-point digital signal processor configured to implement a fixed-point Luenberger Observer resolver-to-digital converter that obtains, based on the digital sine value and the digital cosine value, via fixed-point mathematical operations, an approximate angle of the rotating element.

Example 2. The processing circuitry of example 1, wherein the fixed-point Luenberger Observer resolver-to-digital converter is further configured to: apply a configurable wrap gain to an unwrapped approximate angle to obtain a gain adjusted unwrapped approximate angle.

Example 3. The processing circuitry of example 2, wherein the configurable wrap gain is configured based on a step size of a lookup table, wherein the step size identifies a difference between two or more adjacent cosine values of the cosine values or adjacent sine values of the sine values stored to two entries of the lookup table entries, and wherein the fixed-point Luenberger Observer resolver-to-digital converter is further configured to apply a wrap function to the gain adjusted unwrapped approximate angle to obtain the approximate angle of the rotating element.

Example 4. The processing circuitry of example 3, wherein the fixed-point digital signal processor includes a fixed-size lookup table having a fixed number of lookup table entries that store discrete cosine values over a set of stepped angles and discrete sine values over the set of stepped angles, and wherein the fixed-point Luenberger Observer resolver-to-digital converter is further configured to: access, based on the approximate angle, the fixed-size lookup table to obtain a discrete cosine value for the approximate angle stored to a first lookup table entry of the lookup table entries and a discrete sine value for the approximate angle stored to a second lookup table entry of the lookup table entries; multiply the discrete cosine value by the digital sine value to obtain a first version of the approximate angle; multiply the discrete sine value by a digital cosine value to obtain a second version of the approximate angle; and subtract the second version of the approximate angle from the first version of the approximate angle to obtain an approximate angle error.

Example 5. The processing circuitry of example 4, wherein the fixed-point Luenberger Observer resolver-to-digital converter is further configured to: determine, based on an acceleration signal for controlling a speed of rotation of the rotating element, a velocity of the rotating element; apply a gain adjustment to the approximate angle error to obtain a gain adjusted approximate angle error; and add the velocity to the gain adjusted approximate angle to obtain the unwrapped approximate angle.

Example 6. The processing circuitry of example 4, wherein the fixed number of lookup table entries store the discrete cosine values over the set of stepped angles for defining one of a quarter cosine wave, a half cosine wave, or a whole cosine wave, or wherein the fixed number of lookup table entries store the discrete sine values over the set of stepped angles for defining one of a quarter sine wave, a half sine wave, or a whole sine wave.

Example 7. The processing circuitry of any of examples 1-6, wherein the resolver sensor includes: a rotor; an excitation stator configured to electromagnetically interact with the rotor displaced collinearly with the rotation element; a cosine stator configured to electromagnetically interact with the rotor; and a sine stator configured to electromagnetically interact with the rotor, the sine stator mechanically disposed ninety degrees relative to the cosine stator.

Example 8. The processing circuitry of Example 7, wherein the delta-sigma analog-to-digital converter is configured to: output a carrier signal to the excitation stator to electromagnetically induce a current in the rotor such that the rotor generates a magnetic field to induce one or more of a cosine current in the cosine stator and a sine current in the sine stator; receive, via the cosine stator, an analog representation of the digital cosine signal as the cosine current; receive, via the sine stator, an analog representation of the digital sine signal as the sine current; perform delta-sigma analog-to-digital conversion with respect to the cosine current to obtain the digital cosine value; and perform the delta-sigma analog-to-digital conversion with respect to the sine current to obtain the digital sine value.

Example 9. The processing circuitry of any of examples 1-8, wherein the delta-sigma analog-to-digital converter is configured to obtain, based on electrical interactions with the resolver sensor and without adjusting one or more of the digital sine value and the digital cosine value to account for resolver amplitude modulation, the digital sine signal and the digital cosine signal.

Example 10. The processing circuitry of any of examples 1-9, wherein the delta-sigma analog-to-digital converter is configured to amplify each of the digital cosine value and the digital sine value by a configurable analog-to-digital gain having a power of two.

Example 11. A method comprising: obtaining, by a delta-sigma analog-to-digital converter of a microcontroller, and based on electrical interactions with a resolver sensor, a digital cosine value for an indirectly sensed angle of a rotating element and a digital sine value for the indirectly sensed angle of the rotating element; obtaining, by a fixed-point Luenberger Observer resolver-to-digital converter implemented by a fixed-point digital signal processor of the microprocessor, and based on the digital sine value and the digital cosine value, via the fixed-point mathematical operations, an approximate angle of the rotating element; and outputting, by the fixed-point Luenberger Observer resolver-to-digital converter, the approximate angle to facilitate control of the rotating element.

Example 12. The method of example 11, further comprising: applying a configurable wrap gain to an unwrapped approximate angle to obtain a gain adjusted unwrapped approximate angle, and applying a wrap function to the gain adjusted unwrapped approximate angle to obtain the approximate angle of the rotating element.

Example 13. The method of example 12, wherein the configurable wrap gain is configured based on a step size of a lookup table, wherein the step size identifies a difference between two or more adjacent cosine values of the cosine values or adjacent sine values of the sine values stored to two entries of the lookup table entries, and wherein obtaining the approximate angle comprises applying, by the fixed-point Luenberger Observer resolver-to-digital converter, a wrap function to the gain adjusted unwrapped approximate angle to obtain the approximate angle of the rotating element.

Example 14. The method of example 13, wherein the fixed-point digital signal processor includes a fixed-size lookup table having a fixed number of lookup table entries that store discrete cosine values over a set of stepped angles and discrete sine values over the set of stepped angles, and wherein the method further comprises: accessing, based on the approximate angle, the fixed-size lookup table to obtain a discrete cosine value for the approximate angle stored to a first lookup table entry of the lookup table entries and a discrete sine value for the approximate angle stored to a second lookup table entry of the lookup table entries; multiplying the discrete cosine value by the digital sine value to obtain a first version of the approximate angle; multiplying the discrete sine value by a digital cosine value to obtain a second version of the approximate angle; and subtracting the second version of the approximate angle from the first version of the approximate angle to obtain an approximate angle error.

Example 15. The method of example 14, further comprising: determining, based on an acceleration signal for controlling a speed of rotation of the rotating element, a velocity of the rotating element; applying a gain adjustment to the approximate angle error to obtain a gain adjusted approximate angle error; and adding the velocity to the gain adjusted approximate angle to obtain the unwrapped approximate angle.

Example 16. The method of example 14, wherein the fixed number of lookup table entries store the discrete cosine values over the set of stepped angles for defining one of a quarter cosine wave, a half cosine wave, or a whole cosine wave, or wherein the fixed number of lookup table entries store the discrete sine values over the set of stepped angles for defining one of a quarter sine wave, a half sine wave, or a whole sine wave.

Example 17. The method of any of examples 11-16, wherein the resolver sensor includes: a rotor; an excitation stator configured to electromagnetically interact with the rotor displaced collinearly with the rotation element; a cosine stator configured to electromagnetically interact with the rotor; and a sine stator configured to electromagnetically interact with the rotor, the sine stator mechanically disposed ninety degrees relative to the cosine stator.

Example 18. The method of example 17, further comprising: outputting a carrier signal to the excitation stator to electromagnetically induce a current in the rotor such that the rotor generates a magnetic field to induce one or more of a cosine current in the cosine stator and a sine current in the sine stator; receiving, via the cosine stator, an analog representation of the digital cosine signal as the cosine current; receiving, via the sine stator, an analog representation of the digital sine signal as the sine current; performing delta-sigma analog-to-digital conversion with respect to the cosine current to obtain the digital cosine value; and performing the delta-sigma analog-to-digital conversion with respect to the sine current to obtain the digital sine value.

Example 19. The method of any of examples 11-18, further comprising: obtaining, based on electrical interactions with the resolver sensor and without adjusting one or more of the digital sine value and the digital cosine value to account for resolver amplitude modulation (sign inversion, rectification, carrier multiplication or any other method of demodulation), the digital sine signal and the digital cosine signal; and amplifying each of the digital cosine value and the digital sine value by a configurable analog-to-digital gain having a power of two.

Example 20. A system comprising: a rotating element; a resolver sensor attached to the rotating element; and a microcontroller communicatively coupled to the resolver sensor and configured to control the rotating element, the microcontroller comprising: a delta-sigma analog-to-digital converter communicatively coupled to the fixed-point digital signal processor and electrically coupled to the resolver sensor, the delta-sigma analog-to-digital converter configured to obtain, based on electrical interactions with the resolver sensor, a digital cosine value for an indirectly sensed angle of the rotating element and a digital sine value for the indirectly sensed angle of the rotating element; and a fixed-point digital signal processor configured to implement a fixed-point Luenberger Observer resolver-to-digital converter that obtains, based on the digital sine value and the digital cosine value, via fixed-point mathematical operations, an approximate angle of the rotating element.

Various examples have been described. These and other examples are within the scope of the following claims.

What is claimed is:

1. Processing circuitry comprising:
   a delta-sigma analog-to-digital converter communicatively coupled to a fixed-point digital signal processor and electrically coupled to a resolver sensor attached to a rotating element controlled by the processing circuitry, the delta-sigma analog-to-digital converter configured to obtain, based on electrical interactions with the resolver sensor, a digital cosine value for an indirectly sensed angle of the rotating element and a digital sine value for the indirectly sensed angle of the rotating element; and a fixed-point digital signal processor configured to implement a fixed-point Luenberger Observer resolver-to-digital converter that obtains, based on the digital sine value and the digital cosine value, via fixed-point mathematical operations, an approximate angle of the rotating element.

2. The processing circuitry of claim 1, wherein the fixed-point Luenberger Observer resolver-to-digital converter is further configured to:

apply a configurable wrap gain to an unwrapped approximate angle to obtain a gain adjusted unwrapped approximate angle.

3. The processing circuitry of claim 2, wherein the configurable wrap gain is configured based on a configurable step size of a lookup table, wherein the configurable step size identifies a difference between two or more adjacent cosine values of the cosine values or adjacent sine values of the sine values stored to two entries of a lookup table entries, and wherein the fixed-point Luenberger Observer resolver-to-digital converter is further configured to apply a wrap function to the gain adjusted unwrapped approximate angle to obtain the approximate angle of the rotating element.

4. The processing circuitry of claim 3, wherein the fixed-point digital signal processor includes a fixed-size lookup table having a fixed number of lookup table entries that store discrete cosine values over a set of stepped angles and discrete sine values over the set of stepped angles, and wherein the fixed-point Luenberger Observer resolver-to-digital converter is further configured to:

access, based on the approximate angle, the fixed-size lookup table to obtain a discrete cosine value for the approximate angle stored to a first lookup table entry of the lookup table entries and a discrete sine value for the approximate angle stored to a second lookup table entry of the lookup table entries;

multiply the discrete cosine value by the digital sine value to obtain a first version of the approximate angle;

multiply the discrete sine value by a digital cosine value to obtain a second version of the approximate angle; and subtract the second version of the approximate angle from the first version of the approximate angle to obtain an approximate angle error.

5. The processing circuitry of claim 4, wherein the fixed-point Luenberger Observer resolver-to-digital converter is further configured to:

determine, based on an acceleration signal for controlling a speed of rotation of the rotating element, a velocity of the rotating element;

apply a gain adjustment to the approximate angle error to obtain a gain adjusted approximate angle error; and add the velocity to the gain adjusted approximate angle to obtain the unwrapped approximate angle.

6. The processing circuitry of claim 5, wherein the gain adjusted approximate angle error is weighted by:

a first weight to calculate an approximate velocity; and a second weight to calculate an approximate angle; and wherein a sum of the approximate velocity and approximate angle error weighted by the second weight is further weighted by:

a third weight; and wherein the sum weighted by a third weight and being the sum of the approximate velocity and approximate angle error weighted by the second weight is further weighted by:

a fourth weight; and the first weight, third weight, and fourth weight accounting for a sampling period; and the third weight and fourth weight accounting for the configurable wrap gain.

7. The processing circuitry of claim 4, wherein the fixed number of lookup table entries store the discrete cosine values over the set of stepped angles for defining one of a quarter cosine wave, a half cosine wave, or a whole cosine wave, or wherein the fixed number of lookup table entries store the discrete sine values over the set of stepped angles for defining one of a quarter sine wave, a half sine wave, or a whole sine wave.

8. The processing circuitry of claim 1, wherein the resolver sensor includes:

a rotor;

an excitation stator configured to electromagnetically interact with the rotor displaced collinearly with the rotation element;

a cosine stator configured to electromagnetically interact with the rotor; and a sine stator configured to electromagnetically interact with the rotor, the sine stator mechanically disposed ninety degrees relative to the cosine stator.

9. The processing circuitry of claim 8, wherein the delta-sigma analog-to-digital converter is configured to:

output a carrier signal to the excitation stator to electromagnetically induce a current in the rotor such that the rotor generates a magnetic field to induce one or more of a cosine current in the cosine stator and a sine current in the sine stator;

receive, via the cosine stator, an analog representation of the digital cosine signal as the cosine current;

receive, via the sine stator, an analog representation of the digital sine signal as the sine current;

perform delta-sigma analog-to-digital conversion with respect to the cosine current to obtain the digital cosine value; and perform the delta-sigma analog-to-digital conversion with respect to the sine current to obtain the digital sine value.

10. The processing circuitry of claim 1, wherein the delta-sigma analog-to-digital converter is configured to obtain, based on electrical interactions with the resolver sensor and without adjusting one or more of the digital sine value and the digital cosine value to account for resolver amplitude modulation, the digital sine signal and the digital cosine signal.

11. The processing circuitry of claim 1, wherein the delta-sigma analog-to-digital converter is configured to amplify each of the digital cosine value and the digital sine value by a configurable analog-to-digital gain having a power of two.

12. A method comprising:

obtaining, by a delta-sigma analog-to-digital converter of a microcontroller, and based on electrical interactions with a resolver sensor, a digital cosine value for an indirectly sensed angle of a rotating element and a digital sine value for the indirectly sensed angle of the rotating element;

obtaining, by a fixed-point Luenberger Observer resolver-to-digital converter implemented by a fixed-point digital signal processor of the microprocessor, and based on the digital sine value and the digital cosine value, via a fixed-point mathematical operations, an approximate angle of the rotating element; and outputting, by the fixed-point Luenberger Observer resolver-to-digital converter, the approximate angle to facilitate control of the rotating element.

13. The method of claim 12, further comprising:

applying a configurable wrap gain to an unwrapped approximate angle to obtain a gain adjusted unwrapped approximate angle, and applying a wrap function to the gain adjusted unwrapped approximate angle to obtain the approximate angle of the rotating element.

14. The method of claim 13, wherein the configurable wrap gain is configured based on a configurable step size of a lookup table, wherein the configurable step size identifies a difference between two or more adjacent cosine values of the cosine values or adjacent sine values of the sine values stored to two entries of lookup table entries, and wherein obtaining the approximate angle comprises applying, by the fixed-point Luenberger Observer resolver-to-digital converter, a wrap function to the gain adjusted unwrapped approximate angle to obtain the approximate angle of the rotating element.

15. The method of claim 14, wherein the fixed-point digital signal processor includes a fixed-size lookup table having a fixed number of lookup table entries that store discrete cosine values over a set of stepped angles and discrete sine values over the set of stepped angles, and wherein the method further comprises:

accessing, based on the approximate angle, the fixed-size lookup table to obtain a discrete cosine value for the approximate angle stored to a first lookup table entry of the lookup table entries and a discrete sine value for the approximate angle stored to a second lookup table entry of the lookup table entries;

multiplying the discrete cosine value by the digital sine value to obtain a first version of the approximate angle;

multiplying the discrete sine value by a digital cosine value to obtain a second version of the approximate angle; and subtracting the second version of the approximate angle from the first version of the approximate angle to obtain an approximate angle error.

16. The method of claim 15, further comprising:

determining, based on an acceleration signal for controlling a speed of rotation of the rotating element, a velocity of the rotating element;

applying a gain adjustment to the approximate angle error to obtain a gain adjusted approximate angle error; and adding the velocity to the gain adjusted approximate angle to obtain the unwrapped approximate angle.

17. The method of claim 16, wherein the gain adjusted approximate angle error is weighted by:

a first weight to calculate an approximate velocity; and a second weight to calculate an approximate angle; and wherein a sum of the approximate velocity and approximate angle error weighted by the second weight is further weighted by:

a third weight; and wherein a sum weighted by a third weight and being the sum of the approximate velocity and approximate angle error weighted by the second weight is further weighted by:

a fourth weight; and the first weight, third weight and fourth weight accounting for the sampling period; and the third weight and fourth weight accounting for the configurable wrap gain.

18. The method of claim 15, wherein the fixed number of lookup table entries store the discrete cosine values over the set of stepped angles for defining one of a quarter cosine wave, a half cosine wave, or a whole cosine wave, or wherein the fixed number of lookup table entries store the discrete sine values over the set of stepped angles for defining one of a quarter sine wave, a half sine wave, or a whole sine wave.

19. The method of claim 12, wherein the resolver sensor includes:

a rotor;

an excitation stator configured to electromagnetically interact with the rotor displaced collinearly with the rotation element;

a cosine stator configured to electromagnetically interact with the rotor; and a sine stator configured to electromagnetically interact with the rotor, the sine stator mechanically disposed ninety degrees relative to the cosine stator.

20. The method of claim 19, further comprising:

outputting a carrier signal to the excitation stator to electromagnetically induce a current in the rotor such that the rotor generates a magnetic field to induce one or more of a cosine current in the cosine stator and a sine current in the sine stator;

receiving, via the cosine stator, an analog representation of the digital cosine signal as the cosine current;

receiving, via the sine stator, an analog representation of the digital sine signal as the sine current;

performing delta-sigma modulation with respect to the cosine current to obtain the digital cosine value; and performing the delta-sigma modulation with respect to the sine current to obtain the digital sine value.

21. The method of claim 12, further comprising:

obtaining, based on electrical interactions with the resolver sensor and without adjusting one or more of the digital sine value and the digital cosine value to account for resolver amplitude modulation, the digital sine signal and the digital cosine signal; and amplifying each of the digital cosine value and the digital sine value by a configurable analog-to-digital gain having a power of two.

22. A system comprising:

a rotating element;

a resolver sensor attached to the rotating element; and a microcontroller communicatively coupled to the resolver sensor and configured to control the rotating element, the microcontroller comprising:

a delta-sigma analog-to-digital converter communicatively coupled to a fixed-point digital signal processor and electrically coupled to the resolver sensor, the delta-sigma analog-to-digital converter configured to obtain, based on electrical interactions with the resolver sensor, a digital cosine value for an indirectly sensed angle of the rotating element and a digital sine value for the indirectly sensed angle of the rotating element; and the fixed-point digital signal processor configured to implement a fixed-point Luenberger Observer resolver-to-digital converter that obtains, based on the digital sine value and the digital cosine value, via fixed-point mathematical operations, an approximate angle of the rotating element.

\*　\*　\*　\*　\*